(12) United States Patent
Widdowson et al.

(10) Patent No.: US 6,713,903 B2
(45) Date of Patent: Mar. 30, 2004

(54) MOTOR SYSTEM FOR POSITIONING A LOAD

(75) Inventors: Gary Peter Widdowson, Hong Kong (CN); You Yong Liao, Singapore (SG); Gang Ou, Singapore (SG); Ajit S. Gaunekar, Singapore (SG)

(73) Assignee: ASM Technology Singapore PTE Ltd., Singapore (SG)

( * ) Notice: Subject to any disclaimer, the term of this patent is extended or adjusted under 35 U.S.C. 154(b) by 0 days.

(21) Appl. No.: 10/223,229

(22) Filed: Aug. 15, 2002

(65) Prior Publication Data

US 2004/0032169 A1 Feb. 19, 2004

(51) Int. Cl.[7] .............................................. H02K 41/00
(52) U.S. Cl. ........................................... 310/12; 310/13
(58) Field of Search ............................. 310/12, 13, 14, 310/112, 114

(56) References Cited

U.S. PATENT DOCUMENTS

| | | | | |
|---|---|---|---|---|
| 4,667,139 A | * | 5/1987 | Hirai et al. ................... | 318/687 |
| 4,808,892 A | * | 2/1989 | Dreibelbis ................... | 318/135 |
| 5,087,844 A | | 2/1992 | Takedomi et al. ............. | 310/12 |
| 5,808,381 A | | 9/1998 | Aoyama et al. ............... | 310/12 |
| 6,244,192 B1 | | 6/2001 | Suzuki et al. ................. | 108/20 |

* cited by examiner

*Primary Examiner*—Dang Le
(74) *Attorney, Agent, or Firm*—Ostrolenk, Faber, Gerb & Soffen, LLP (57) ABSTRACT

The invention provides a motor system and a method for positioning a load. The system comprises support means such as an XY table for supporting the load. A first motor and a second motor cooperate to drive the load, whereby the first motor is adapted to provide higher thrust than the second motor and the second motor is adapted to deliver higher positioning accuracy than the first motor during a positioning sequence to position the load.

22 Claims, 7 Drawing Sheets

MOTOR SYSTEM FOR POSITIONING A LOAD

FIELD OF THE INVENTION

The present invention relates to an electric motor system that may be used to adjust the position of a load in relation to a plane, and it is applicable for positioning a load associated with a platform or stage of a positioning device such as an XY table.

BACKGROUND AND PRIOR ART

Various kinds of motors are used in industry to move loads and to control their positions. The linear electric motor, i.e. a motor that produces thrust in a straight line by electromagnetic interaction, is one such kind of motor.

For example, U.S. Pat. No. 5,808,381 for a "Linear Motor" discloses several configurations of linear motors using permanent magnets in conjunction with coils in air gaps disposed within an area having a magnetic flux. U.S. Pat. No. 5,087,844, also for a "Linear Motor", discloses a moving coil linear motor with a pair of permanent magnet assemblies on both sides of a central yoke opposing each other via a gap therebetween. Multi-phase, interlaced coil assemblies are disposed in the air gaps such that the force produced in one permanent magnet assembly acts in the same direction as the other. The magnets are shaped in such a way that the variation of magnetic flux density in the direction of motion of the moving part more closely approximates the ideal sinusoidal form than in conventional linear motors.

In the field of semiconductor assembly machines, the past decade has seen a shift from rotary motors and ball screw-based translation stages to linear motor based ones. This is so especially in the area of high speed, high precision XY tables used to move a load in two separate axes on a plane. XY tables comprise separate moving tables or platforms, each capable of moving in a single axis. A combination of movement in both axes allows an object to be positioned in any position on a plane. For instance, XY tables can be used as positioning devices in semiconductor assembling equipment, machine tools and measurement equipment.

In the conventional design of a linear motor driven XY table, each of the two axes on a plane is actuated by a linear motor in closed loop servo control, while feedback is provided by digital encoders, one for each axis. A variety of designs of linear motor may be used with such design of XY table.

Figure 6A:
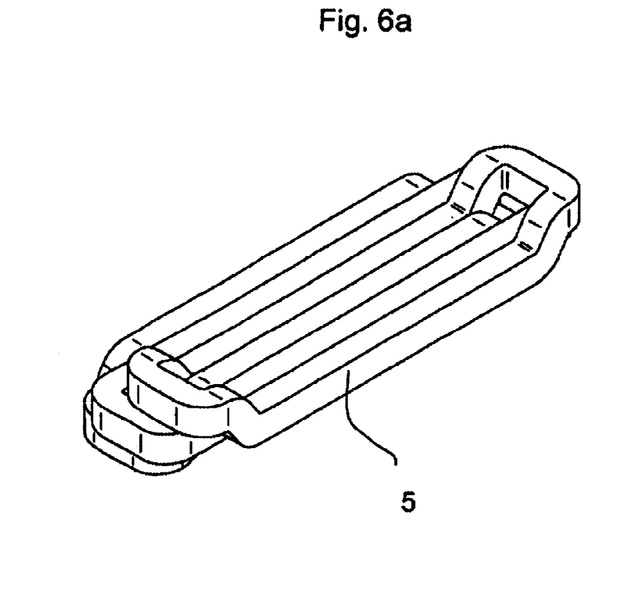
FIGS. 6a and 6b illustrate designs of interlaced coil configurations of a moving coil motor and moving magnet motor respectively, that are usable with a motor system according to the invention.
Figure 6B:
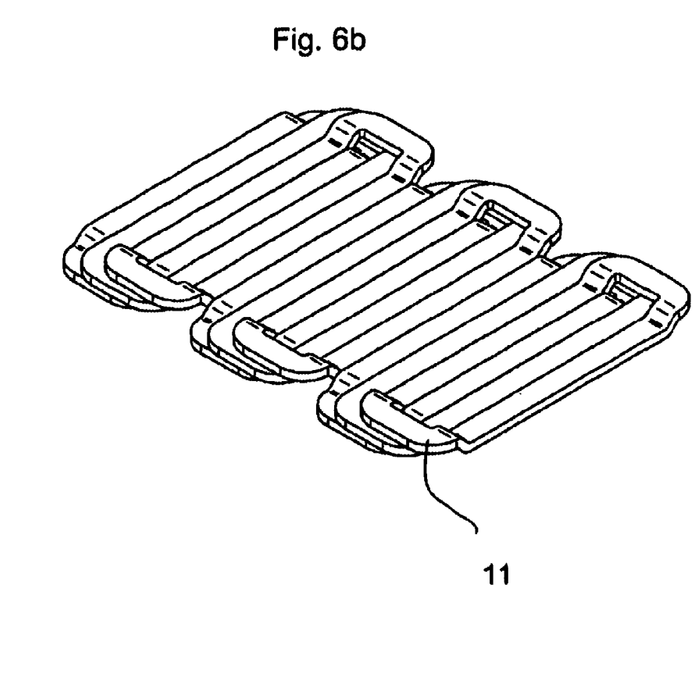
Figure 6C:
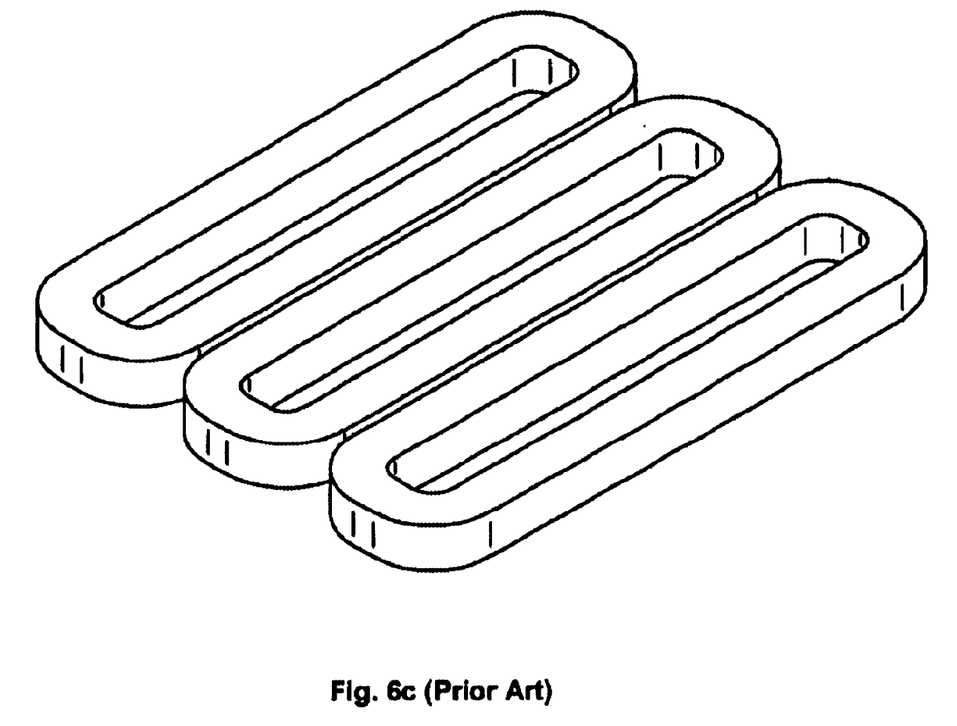
FIG. 6c illustrates a design of concentrated or non-interlaced coil windings of the prior art.

Moving coil motors without iron cores are by far the most commonly-used motors for XY tables in the backend semiconductor industry. Whether single phase or multi-phase, they entail the use of a cantilevered coil bracket. The cantilever contributes substantially to the moment of inertia of a moving mass (including the load) about the axes of motion and also about the axis perpendicular to the axis of motion. This is undesirable from the point of view of vibrations in the yaw and pitch modes. Hence one of the goals of the motor designer is to keep the coil assembly as compact as possible and thereby to minimize the cantilever length. Thus, in a multi-phase motor, distributed coil windings are preferred over concentrated windings. Another advantage of distributed coil windings is better dissipation of the heat generated. FIG. 6c is an example of concentrated coil windings while FIGS. 6a and 6b are examples of distributed coil windings.

An example of an XY table comprising one linear motor for each axis is disclosed in U.S. Pat. No. 6,244,192 for an "XY Table". The improvement of this design over the prior art is mentioned as the use of linear motors instead of ball feed screws connected to driver motors when positioning a load along the X and Y axes. Amongst other things, ball feed screws are less accurate due to errors in screw connection. Further, high-speed acceleration and deceleration is not possible.

Nevertheless, one problem relating to control of high bandwidth servo controlled motors such as that used in the aforesaid patent is the effect of the offset current in the driver circuit which may vary with time due to changes in temperature and other aging effects in the circuit. This offset current manifests as an undesired motor force equal to the product of the motor force constant and the offset current. The force constant of a motor can be defined as the force produced per unit current. For a multi-phase motor, the force constant is normally based on the peak value of the sinusoidal current in each of its phases. A linear motor having a high force constant is sensitive even to small amounts of driver offset and spurious noise.

It is often difficult to meet the contradictory requirements of high precision and high speed while using just one motor, which has only one force constant. When the force constant of the motor is higher, the larger will be the undesirable force from the effects from interferences such as driver offset and spurious noise. Thus, it becomes difficult to control such a motor, especially in maintaining a steady stationary position at the end of its stroke. However, from the point of view of faster operation with a compact motor without need for a very high current from the driving circuit, the force constant of the motor needs to be adequately high. It follows that the disadvantage of controlling each axis with a single motor is that speed has to be traded off against precision.

It would be advantageous to be able to deliver a high force employing a high force constant motor to a table holding a load while moving it over a greater distance and also to deliver a lower force when positioning with more precision over a smaller distance is desired.

SUMMARY OF THE INVENTION

It is an object of the invention to seek to provide an improved motor system for positioning a load with greater speed and precision as compared to the prior art as discussed above.

According to a first aspect of the invention there is provided a motor system for positioning a load, comprising support means for supporting the load and a first motor and a second motor, the first motor and second motor cooperating to drive the load, whereby the first motor is adapted to provide higher thrust than the second motor and the second motor is adapted to deliver higher positioning accuracy than the first motor during a positioning sequence to position the load.

According to a second aspect of the invention there is provided a method for positioning a load, comprising the use of a first motor cooperating with a second motor to drive the load, wherein the first motor provides higher thrust to the load, and the second motor delivers higher positioning accuracy to the load.

Using the invention, it is possible to provide two linear motors working in tandem that may move a load on an XY table, to provide fast and accurate positioning of the load. The overall size of a cantilever of a moving coil motor may also be reduced in overall size, rendering the system compact and with a lower moment of inertia about the centre of gravity perpendicular to the axis of motion. Using the invention it may also be possible to facilitate the segregation and dispersion of heat loss over a wider area, thus leading to a lower temperature of operation.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT

Figure 1:
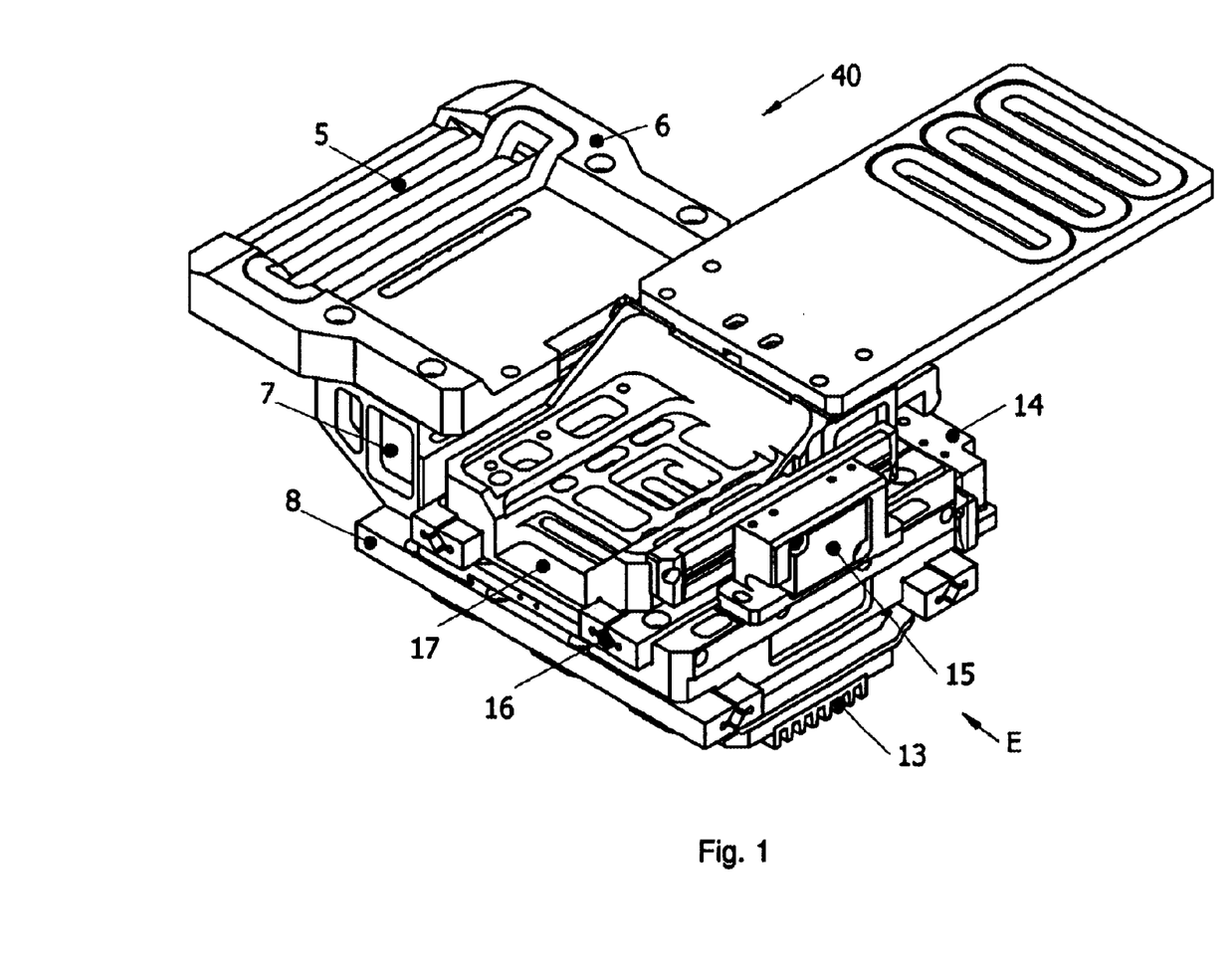
FIG. 1 is an isometric view of an XY table comprising an X stage and Y stage, which incorporates a motor system according to a preferred embodiment of the present invention.

Referring to the drawings, FIG. 1 is an isometric view of an XY table 40 incorporating a motor system according to a preferred embodiment of the present invention. Magnet assemblies of the XY table 40 have been removed to illustrate the motor system more clearly. The XY table comprises generally a support means such as an X stage 7 and a Y stage 17, the X stage 7 being movable along an X axis on X axis crossed roller guides 8, and the Y stage 17 being movable along a Y axis along Y axis crossed roller guides 16. The support means 7, 17 support a load (not shown) to be positioned on a plane. Positions of the X stage 7 are determinable by an X axis encoder 14 whereas positions of the Y stage 17 are determinable by a Y axis encoder 15. Upper coils 5 are supported on a cantilevered bracket 6 on the X stage 7 which comprise part of a first motor 1 to provide a first, high force constant, electromotive force to the X stage 7. The first motor 1 is thus meant to provide a high thrust to drive the X stage 7.

Figure 2:
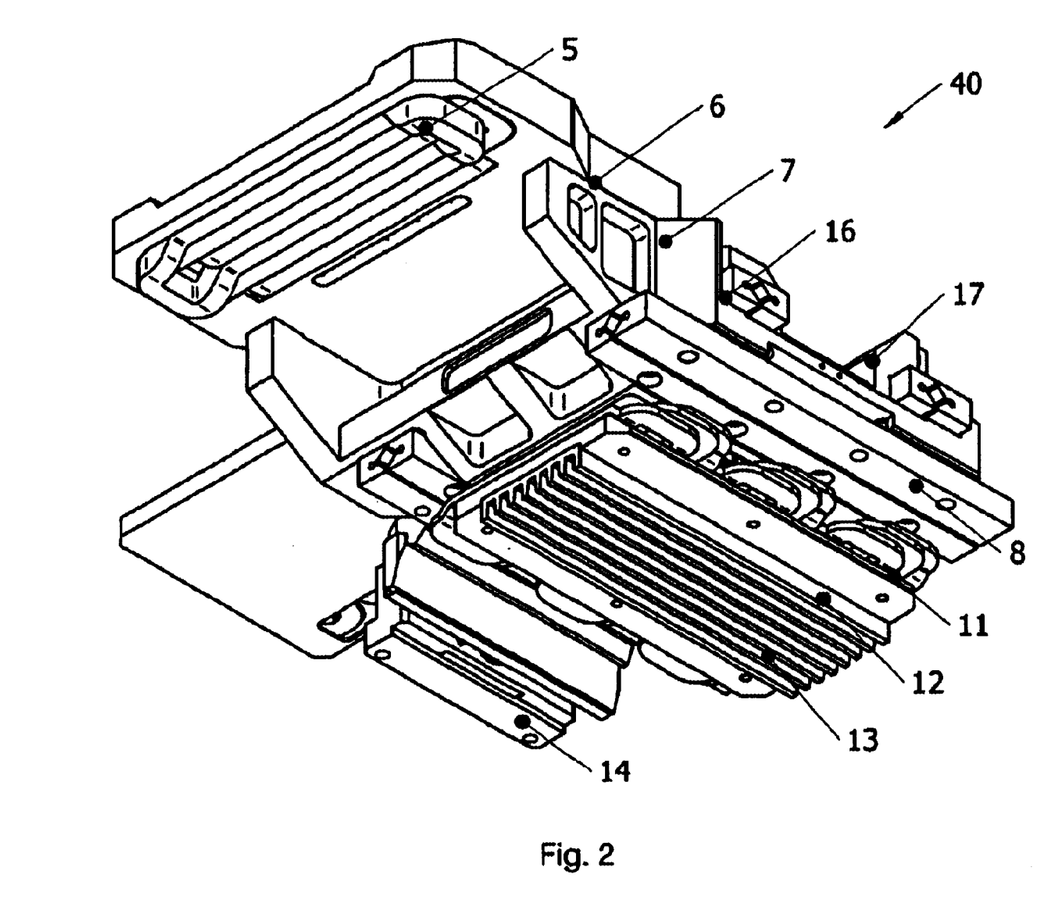
FIG. 2 is an isometric view of the bottom of the XY table of FIG. 1.

FIG. 2 is an isometric view of the bottom of the XY table 40 of FIG. 1. This view shows lower coils 11 comprising part of a second motor 2 which provides a second electromotive force to the X stage 7. The lower coils 11 are mounted on a support or back iron 12. A heat sink 13 is preferably added to the back iron 12 on the side away from the lower coils 11 primarily to facilitate the dissipation of heat generated by the second motor 2 of the XY table 40.

Figure 3:
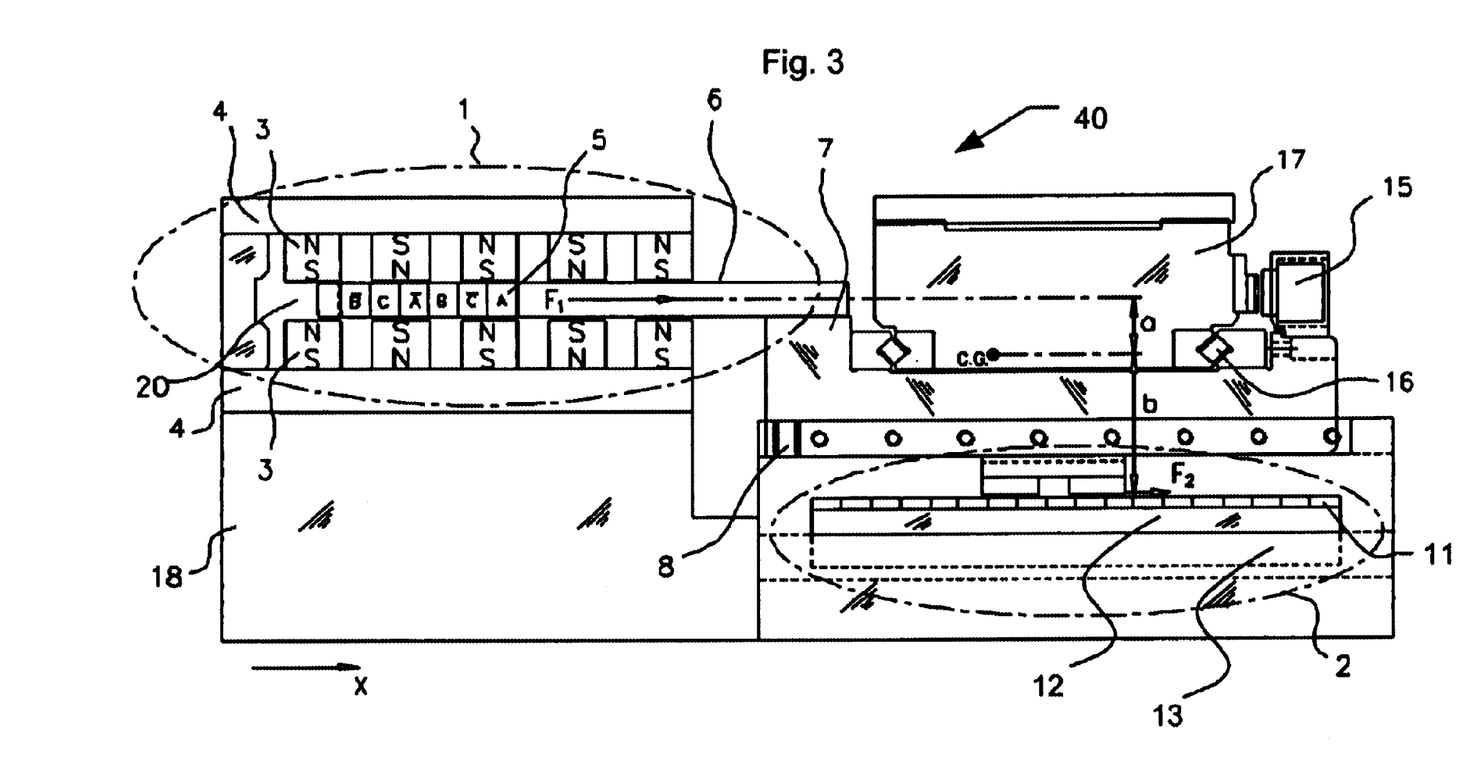
FIG. 3 is a schematic side view of the XY table looking from direction D of FIG. 1.

FIG. 3 is a schematic side view of the XY table 40 looking from direction D of FIG. 1. The X stage 7 is adapted to move in the X-axis, and the Y stage 17 is mounted onto the X stage 7 and is adapted to move in the Y axis on a plane. The Y stage 17 is connectable to an external apparatus requiring positioning in the XY-axis, such as a bond head for a wire bonder (not shown).

In relation to the X stage 7, it is supported by and moveable along X-axis crossed roller guides 8. The first motor 1 is preferably a moving coil motor providing a high force constant. The stator of the first motor 1 thus consists of an air gap 20, formed between two rows of permanent magnets 3 affixed in a specific pattern on yokes 4, made from material of high magnetic permeability. This results in a nominally sinusoidal variation of magnetic flux in the air gap 20 along the X axis of motion. Further, the upper coils 5 are disposed within the air gap 20 to allow translational movement. In the preferred embodiment, the configuration of the coils 5 is made of distributed or interlaced windings, as illustrated in FIG. 6a. The X stage 7,is supported by and movable along the X-axis crossed roller guides 8 with respect to a fixed table base 18.

A combination of an electric current flowing through the upper coils 5 and the magnetic flux results in movement of the cantilevered bracket 6 and X-stage 7 along the X-axis by electromagnetic interaction. The direction of travel of the X-stage in the X-axis may thus be changed by changing the direction of current flowing through the upper coils 5.

The X stage 7 also relies for its motion on a second motor 2. The second motor 2 is described in more detail with reference to FIGS. 5a and 5b. The first motor 1 preferably has a larger force constant for higher acceleration of the load resulting in faster operation. The second motor 2 has a relatively lower force constant, which allows it to deliver higher positioning accuracy than the first motor 1 for the same amount of current provided to the motors 1,2, to fine-tune the position of the load.

In this preferred embodiment, the motor system of the invention is incorporated into the X stage 7, but it is also possible with suitable modification for the motor system to be incorporated into the Y stage 17. The first and second motors 1,2 are coupled and cooperate to move the lower, heavier X stage 7 so that on the one hand, a large resultant force is derived from both the motors operating in tandem while on the other hand, precise maintenance of position is achieved solely through control of the second motor 2 at the end of a stroke. In order to achieve this, the two motors 1,2 are preferably driven and controlled independently of each other by separate drivers. In such an arrangement, although both motors contribute to the motive force while executing a specified movement, servo control of the X stage 7 at the end of the stroke would be effected only by the second motor 2 of lower force constant with higher precision.

Alternatively, in applications where the requirement of position control at the end of the motion stroke is not particularly stringent, the motors may be connected in series or in parallel, to be driven and controlled by a single driver and a single controller respectively. This would simplify driver and controller circuits while retaining the advantages of compactness and better dispersal of the heat generated.

Figure 4:
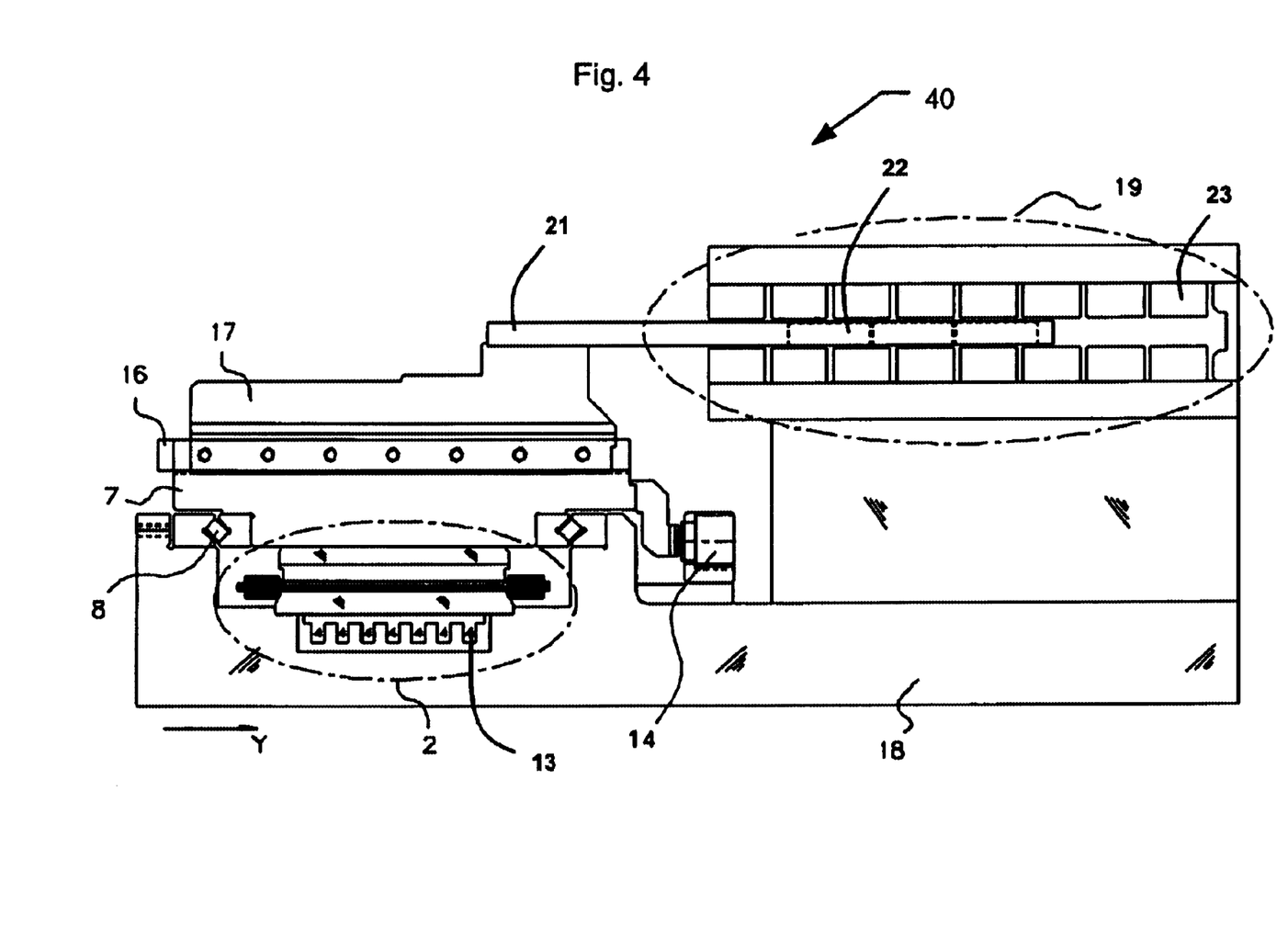
FIG. 4 is a schematic side view of the XY table looking from direction E of FIG. 1.

FIG. 4 is a side view of the XY table 40 looking from-direction E of FIG. 1. The Y stage 17 is illustrated with a single Y-axis motor 19. A Y-axis cantilevered bracket 21 holds a series of Y-axis motor coils 22 and is attached to the Y stage 17. The Y-axis motor coils 22 are disposed in an air gap formed between top and bottom permanent magnets 23. The permanent magnets 23 create a magnetic flux in the air gap. The principle of motion of the Y stage 17 is similar to that of the first motor 1 for the X stage and will not be repeated. As previously mentioned, a second motor may optionally be included for the Y stage 17 although it is not preferred in the described embodiment.

In the described embodiment, the Y motor 19 for the Y stage 17, which is lighter and hence easier to control, is of conventional design, preferably of moving coil type (see FIG. 6a) mounted on the Y stage 17 and supported on linear crossed roller guides 16. These linear crossed roller guides 16 of the Y-stage are in turn mounted on the top side of the X-stage 7, orthogonal to the orientation of the X-axis crossed roller guides 8 of the X stage 7. The Y motor 19 receives feedback from the Y-axis digital encoder 15.

Also illustrated in FIG. 4 is the X-axis encoder 14 for the X stage 7. The design of the heat sink 13 is also shown in more detail. Both the first and second motors 1,2 receive feedback from the digital X-axis encoder 14.

Figure 5A:
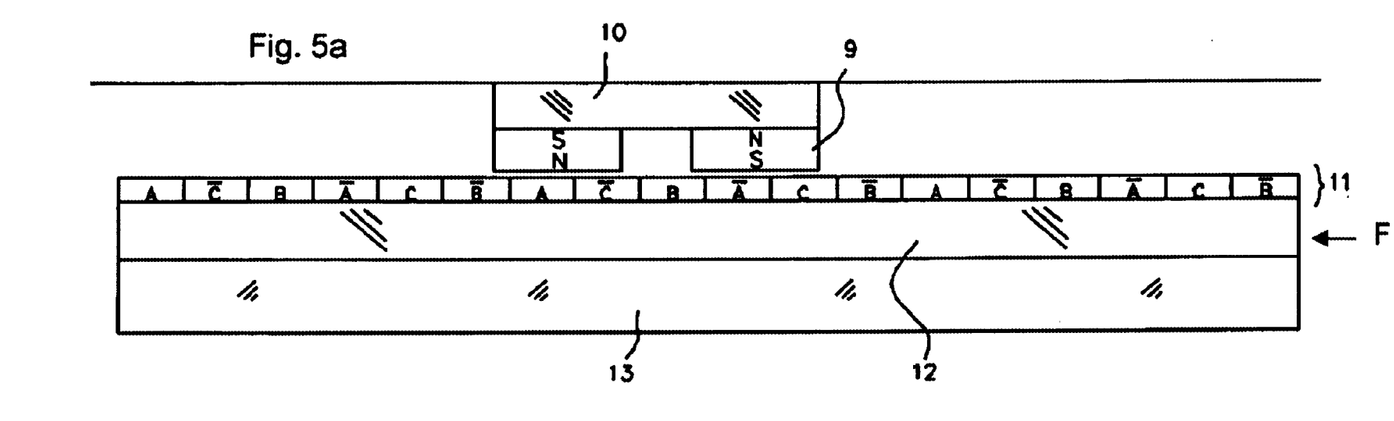
FIGS. 5a and 5b are magnified side views of the second motor of FIG. 3.

FIG. 5a is a magnified side view of the second motor 2 of FIG. 3, which is positioned below the X stage 7. The stator of the second motor 2 includes a multiplicity of lower coils 11 preferably in the form of distributed or interlaced windings as illustrated in FIG. 6b. The lower coils 11 are mounted on a magnetically permeable support or back iron 12. At the base of the back iron 12, a heat sink 13 is arranged to dissipate heat from the second motor 2. In a design of the second motor 2, permanent magnets 9 are affixed on a yoke 10, made from material of high magnetic permeability. The yoke 10 is mounted on the underside of the X stage 7. The preferred embodiment is of a moving magnet design, using slotless distributed coil windings 11, because a slotless design does not give rise to cogging forces, which may complicate control.

Figure 5B:
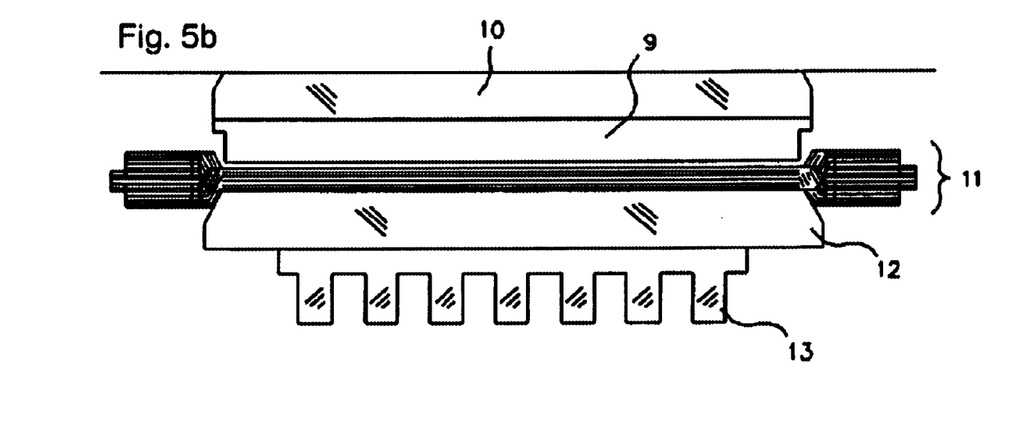

FIG. 5b is a view of the second motor 2 looking from direction F of FIG. 5a.

A positioning sequence to position the load will now be described. In order to actuate movement of the X stage 7, current is delivered through the upper coils 5 and lower coils 11, such that electromagnetic interaction forces are generated to move the X stage 7 in one direction by combination of the first motor 1 and the second motor 2. The combination of forces results in accelerated movement of the X stage 7 to a desired position on the X-axis. As the X stage 7 reaches its destination, the first motor 1 is deactivated, for example, by cutting off the current-flow in the upper coils 5. However, the second motor 2 continues to generate a force for fine-tuning the position of the X stage 7.

The force takeoff elements of the first and second motors 1,2 are situated at different heights from the centre of gravity (C.G.) of the total moving mass of the X stage. They are so arranged that the product of the force ($F_1$) of the first motor 1 with its offset (a) from the C.G. is nominally equal to the product of the corresponding quantities ($F_2$, b) for the second motor 2 (see FIG. 3). This can be expressed as:

$$F_1 \times a = F_2 \times b$$

This ensures that there is almost no residual moment on the X-axis crossed roller guides 8 during motion, leading to a higher operational life for the guides.

Since the force demands of the X stage 7 are split between the first and second motors 1,2, each motor is smaller in size than in the case where only one motor is provided for the X stage 7. In particular, this translates to a smaller and compact coil assembly 5, which results in a shorter cantilevered bracket 6, thus leading to a higher dynamic stiffness of the coil bracket 6 and also a lower moment of inertia of the XY table 40 as a whole. Other variations in design, employing a similar tandem motor arrangement can also be conceived by those ordinarily skilled in the art.

The invention described herein is susceptible to variations, modifications and/or additions other than those specifically described and it is to be understood that the invention includes all such variations, modifications and/or additions which fall within the spirit and scope of the above description.

What is claimed is:

1. A motor system for positioning a load, comprising support means for supporting the load; a first motor; and a second motor, the first motor and the second motor cooperating to drive the same load, whereby the first and the second motors are not each driving respective other loads rather than both driving the load, and wherein the first motor is adapted to provide higher thrust than the second motor and the second motor is adapted to deliver higher positioning accuracy than the first motor during a positioning sequence to position the load.

2. A motor system according to claim 1, wherein the first motor has a higher force constant than the second motor.

3. A motor system according to claim 1, wherein the fist motor is adapted to generate a force to move the load over a relatively larger distance, and the second motor is adapted to generate a force to fine-tune the position of the load at its intended position.

4. A motor system according to claim 1, wherein the first and/or second motor comprises an electrical coil for conducting a current, and wherein there is an air gap formed between a pair of magnets with the coil being positioned in the air gap, the magnets being adapted to create a magnetic flux for electromagnetic interaction with the coil to move the load.

5. A motor system according to claim 4, wherein the first motor comprises a moving coil linear motor and the second motor comprises a moving magnet linear motor.

6. A motor system according to claim 4, wherein the coil has windings comprising distributed or interlaced windings.

7. A motor system according to claim 1, wherein the support means is a stage of an XY table.

8. A motor system according to claim 7, adapted to drive an X stage of the XY table.

9. A motor system according to claim 7, adapted to drive a Y stage of the XY table.

10. A motor system according to claim 1, wherein forces from the first and second motors are adapted to be combined to provide a thrust to move the platform over a larger distance at the beginning of a positioning sequence, while the force from the second motor only is adapted to be used to fine-tune the position of the load towards the end of the positioning sequence.

11. A motor system according to claim 1, wherein the first and second motors are controlled independently by separate drivers or controllers.

12. A motor system according to claim 1, wherein the first and second motors are connected in series or in parallel and are controlled by a single driver or controller.

13. A method for positioning a load, comprising the use of a first motor cooperating with a second motor to drive the same load whereby the first and the second motors are not each driving respective other loads rather than both driving the load, and, wherein the first motor provides higher thrust to the load, and the second motor delivers higher positioning accuracy to the load.

14. A method according to claim 13, wherein the first motor has a higher force constant than the second motor.

15. A method according to claim 13, wherein the first motor generates a force to move the load over a relatively larger distance, and the second motor generates a force to fine-tune the position of the load at its intended position.

16. A method according to claim 13, wherein the first and/or second motor comprises an electric coil conducting a current, and the coil is positioned in an air gap formed between a pair of magnets, the magnets creating a magnetic flux for electromagnetic interaction with the coil to move the load.

17. A method according to claim 16, wherein the first motor comprises a moving coil linear motor and the second motor comprises a moving magnet linear motor.

18. A method according to claim 16, wherein the coil has windings selected from a group comprising distributed and interlaced windings.

19. A method according to claim 13, wherein the first and second motors drive a stage of an XY table, to which the load is coupled.

20. A method according to claim 13, comprising the steps of driving the load using a combination of a force from the first motor and a force from the second motor at the commencement of a positioning sequence; and deactivating the force provided by the first motor towards the end of the sequence, whereby only the force of the second motor is used to fine-tune a position of the load.

21. A method according to claim 13, wherein the first and second motors are controlled independently by separate drivers or controllers.

22. A method according to claim 13, wherein the first and second motors are connected in series or in parallel and are controlled by a single driver or controller.

* * * * *